United States Patent
Gilmore

(10) Patent No.: US 9,844,161 B2
(45) Date of Patent: Dec. 12, 2017

(54) RETAINER FOR ELECTRONIC MODULES

(71) Applicant: Pentair Technical Products, Inc., Minneapolis, MN (US)

(72) Inventor: Jackson Gilmore, San Diego, CA (US)

(73) Assignee: Pentair Technical Products, Inc., San Diego, CA (US)

( * ) Notice: Subject to any disclaimer, the term of this patent is extended or adjusted under 35 U.S.C. 154(b) by 0 days.

(21) Appl. No.: 15/165,747

(22) Filed: May 26, 2016

(65) Prior Publication Data

US 2016/0353597 A1 Dec. 1, 2016

Related U.S. Application Data

(60) Provisional application No. 62/167,196, filed on May 27, 2015.

(51) Int. Cl.
| | | |
|---|---|---|
| *H05K 1/14* | (2006.01) | |
| *H05K 7/20* | (2006.01) | |
| *F16B 13/04* | (2006.01) | |
| *H05K 7/14* | (2006.01) | |

(52) U.S. Cl.
CPC ......... *H05K 7/1404* (2013.01); *H05K 7/1442* (2013.01)

(58) Field of Classification Search
CPC ........ H05K 7/1404; H05K 7/1442; F16B 2/14
USPC ..... 248/316.2, 412, 413; 361/707, 709, 720, 361/740; 403/24
See application file for complete search history.

(56) References Cited

U.S. PATENT DOCUMENTS

| | | | |
|---|---|---|---|
| 3,820,592 A | | 6/1974 | Lander |
| 3,845,359 A | | 10/1974 | Fedele |
| 4,480,287 A | * | 10/1984 | Jensen ................. H05K 7/1404 361/707 |
| 4,824,303 A | * | 4/1989 | Dinger ..................... F16B 2/14 254/104 |
| 4,971,570 A | | 11/1990 | Tolle et al. |
| 5,071,013 A | | 12/1991 | Peterson |
| 5,090,840 A | | 2/1992 | Cosenza |
| 5,220,485 A | | 6/1993 | Chakrabarti |
| 5,262,587 A | * | 11/1993 | Moser .................. H05K 7/1404 174/15.1 |
| 5,290,122 A | * | 3/1994 | Hulme ................. H05K 7/1404 165/80.2 |
| 5,382,175 A | | 1/1995 | Kunkel |
| 5,407,297 A | * | 4/1995 | Hulme ................. H05K 7/1404 403/24 |
| 5,472,353 A | * | 12/1995 | Hristake .............. H05K 7/1404 361/709 |
| 6,285,564 B1 | | 9/2001 | O'Brien |
| 7,336,493 B2 | | 2/2008 | Berkenbush et al. |

(Continued)

Primary Examiner — Tan Le
(74) Attorney, Agent, or Firm — Quarles & Brady LLP

(57) ABSTRACT

A retaining arrangement can secure an electronic module to a body. Two end wedges, each with a ramped end, can be mounted on a rail. At least one inner wedge can be slidably mounted on the rail between the two end wedges, with ramped ends of the at least one inner wedge engaging the ramped ends of the two end wedges. Each of the ramped ends can have a respective angle of between 20 degrees and 30 degrees. An even number of inner wedges can be provided. A pin extending through mounting holes in one of the end wedges, but not extending into the rail, can secure the end wedge to a screw for moving the retaining arrangement into the compressed configuration.

21 Claims, 10 Drawing Sheets

(56) References Cited

U.S. PATENT DOCUMENTS

| | | |
|---|---|---|
| 7,883,289 B2 | 2/2011 | Weisman |
| 8,456,846 B2 | 6/2013 | Mosier et al. |
| 8,559,178 B2 | 10/2013 | Monson et al. |
| 8,743,544 B2 | 6/2014 | Monson et al. |
| 2003/0048618 A1* | 3/2003 | Adams, Sr. .......... H05K 7/1442 361/740 |
| 2007/0253169 A1* | 11/2007 | Clawser ............... H05K 7/1404 361/720 |

* cited by examiner

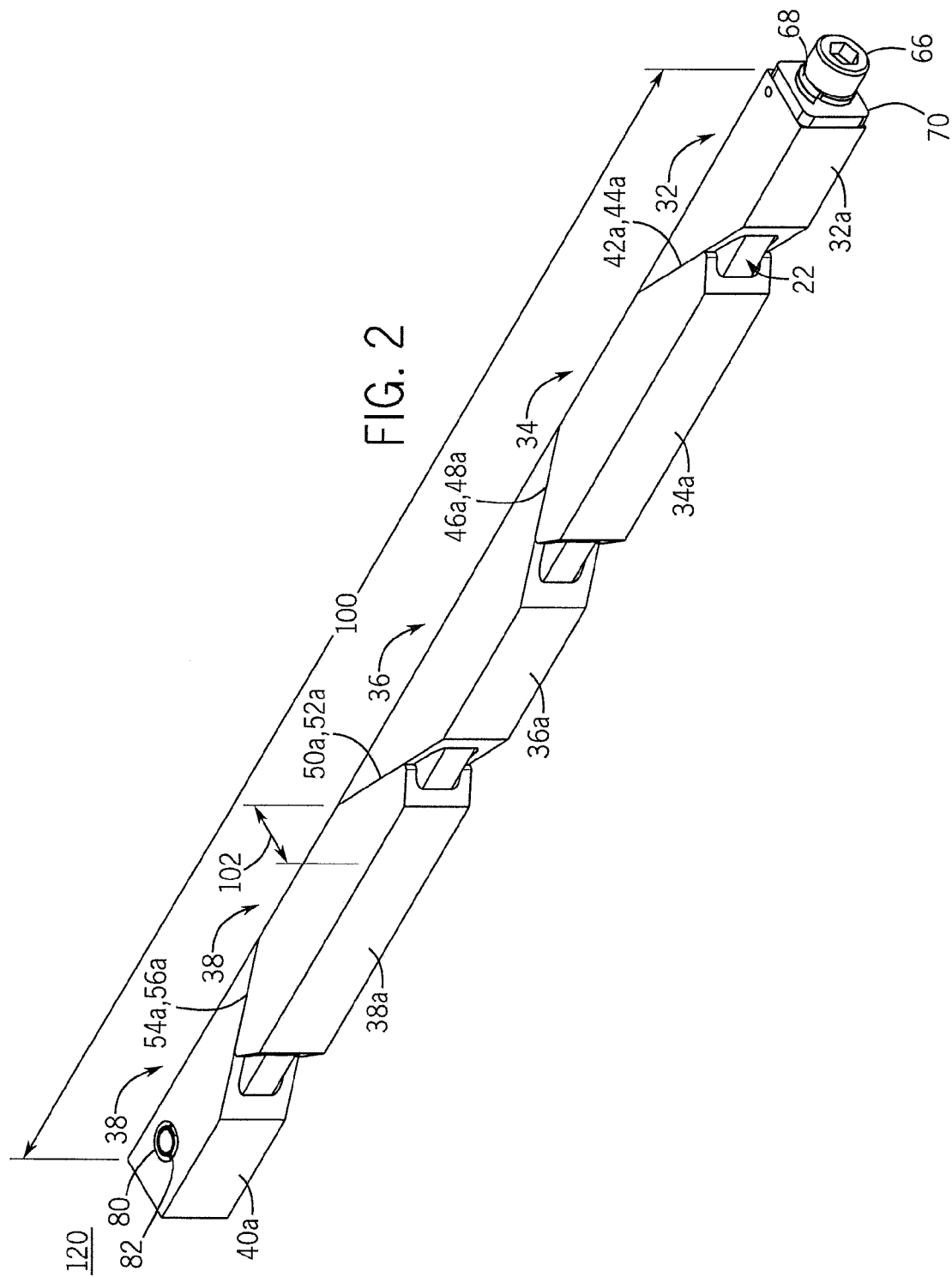

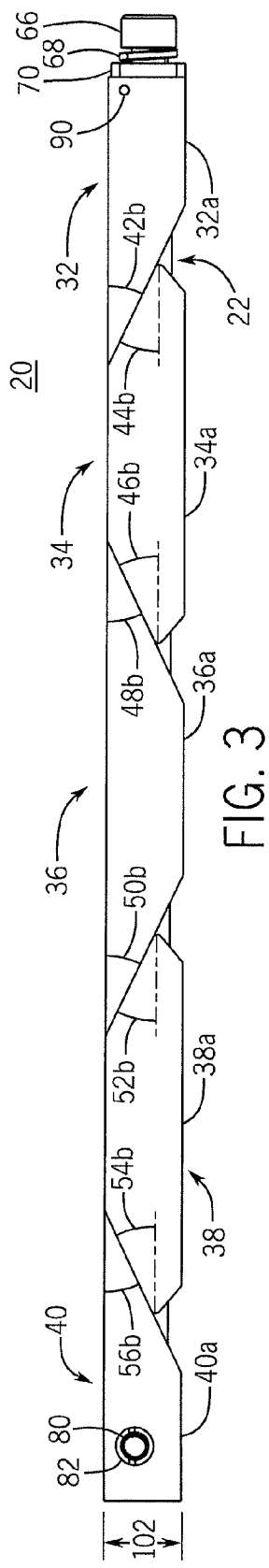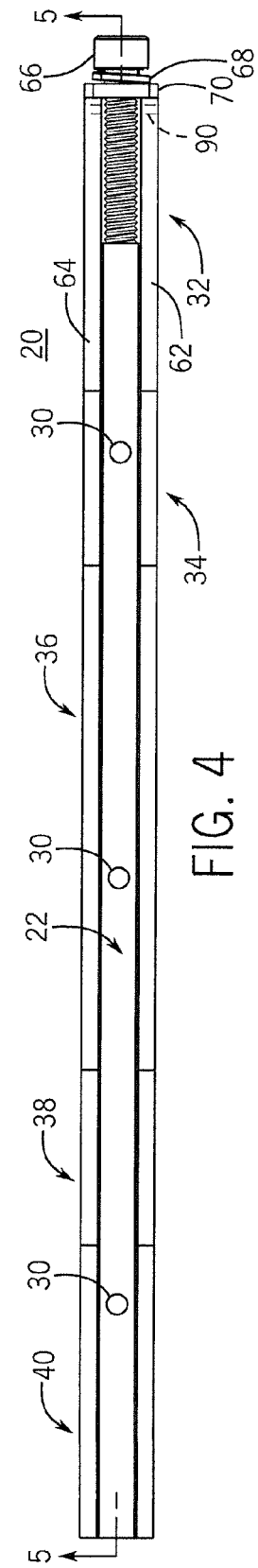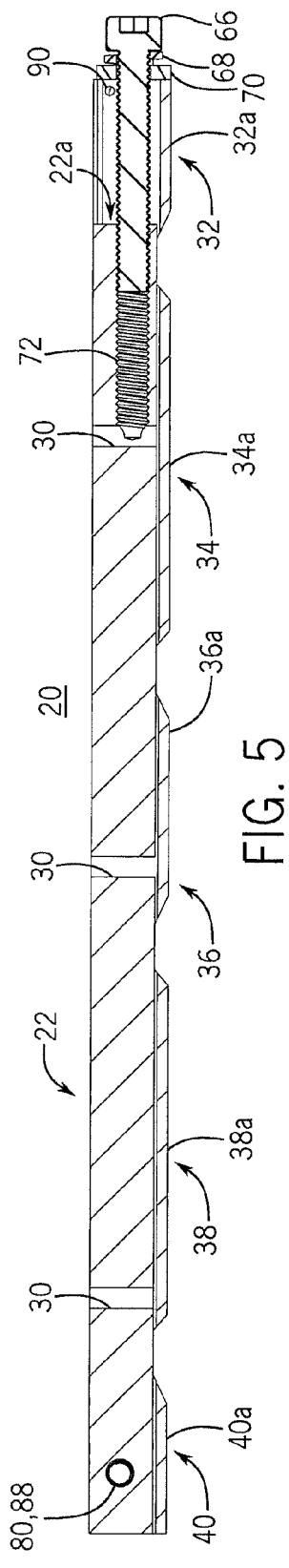

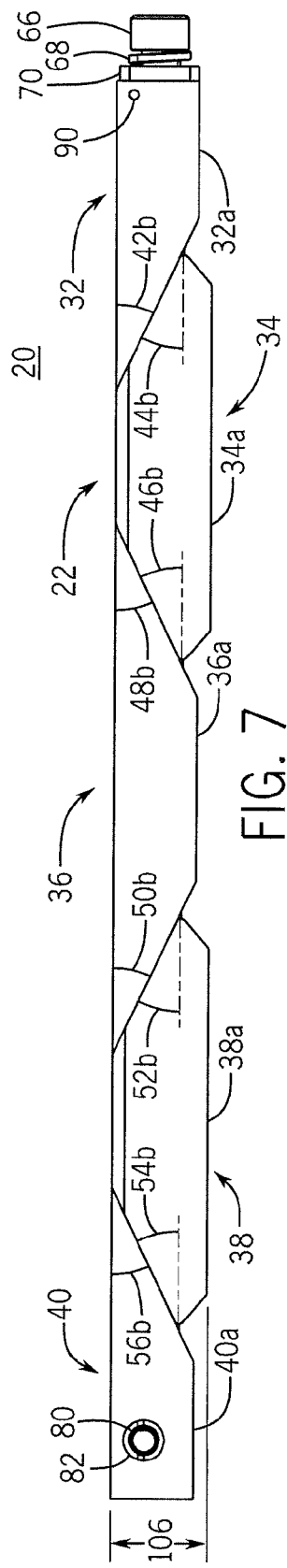
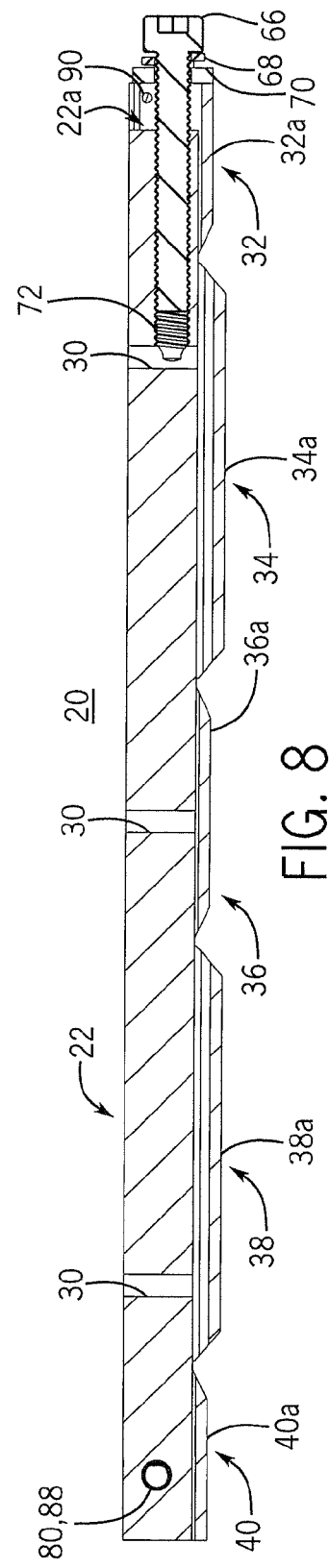
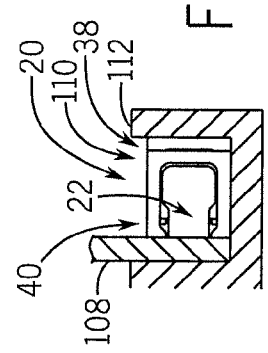

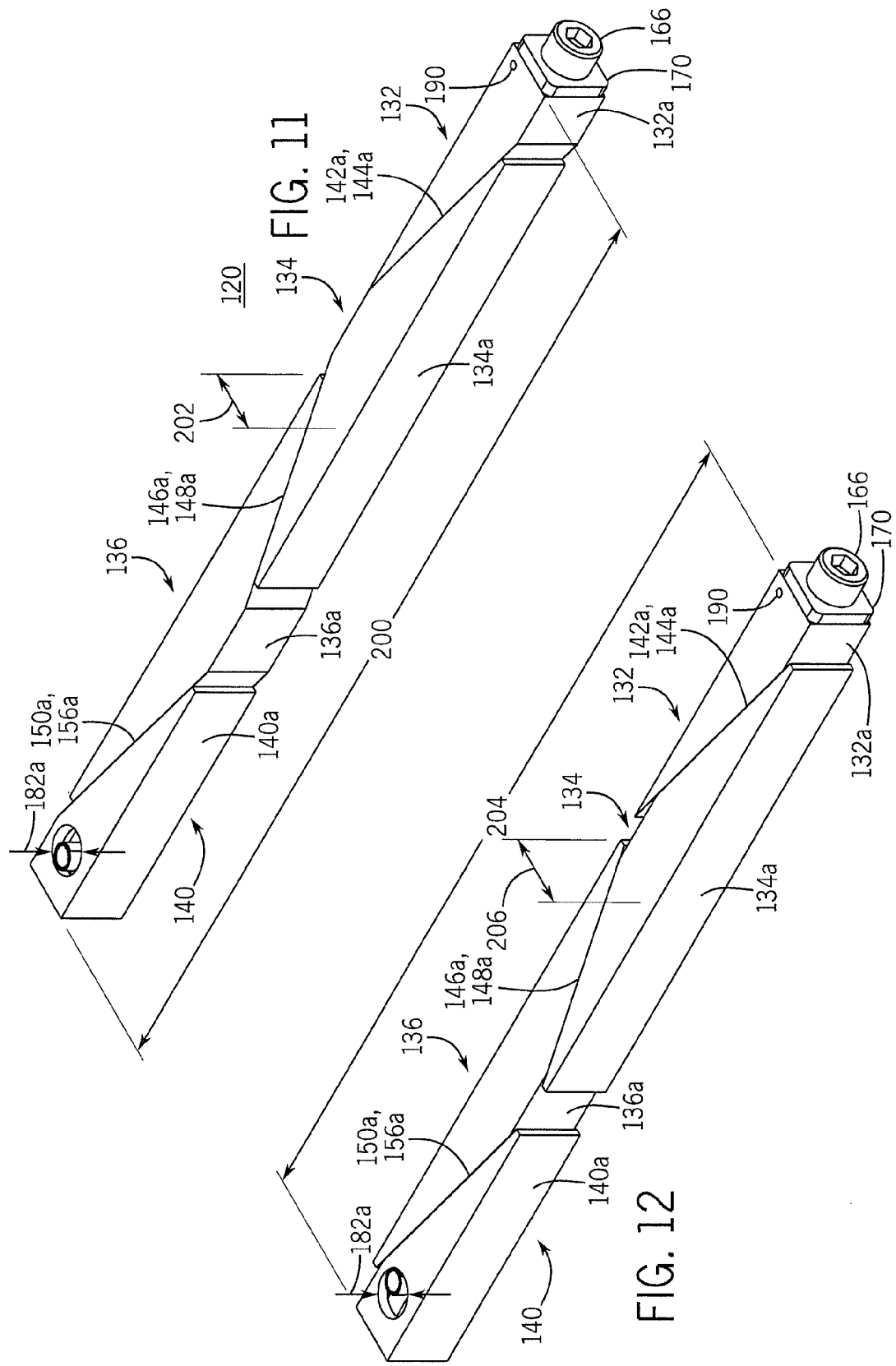

U.S. 9,844,161 B2

RETAINER FOR ELECTRONIC MODULES

RELATED APPLICATIONS

This application claims priority under 35 U.S.C. §119 to U.S. Provisional Patent Application No. 62/167,196 filed on May 27, 2015, the entire contents of which are incorporated herein by reference.

BACKGROUND

In different settings, it may be useful for retainers to secure electronic modules to other bodies. For example, it may be useful to secure a printed circuit board or circuit card with respect to a cold plate, such that the board or card maintains a relatively fixed location when subjected to vibrations or other forces. Securing a circuit board or card to a cold plate may also support the removal of heat from the board or card, including via heat transfer from the board or card to the cold plate via the retainer.

SUMMARY

Some embodiments of the invention provide a retaining arrangement for securing an electronic module to a body, for use with a rail that extends in a longitudinal direction. A first end wedge with a first ramped end can be mounted on the rail. A second end wedge with a second ramped end can be mounted on the rail. At least one inner wedge with a third ramped end and a fourth ramped end can be slidably mounted on the rail between the first end wedge and the second end wedge, with the third ramped end engaging the first ramped end and the fourth ramped end engaging the second ramped end. An adjustment device can be configured to move the retaining arrangement into a compressed configuration, to secure the electronic module to the body, by reducing a distance between the first end wedge and the second end wedge in the longitudinal direction and thereby urging a first clamping surface of the at least one inner wedge away from the rail. Each of the first ramped end, the second ramped end, the third ramped end, and the fourth ramped end can extend at a respective angle of between 20 degrees and 30 degrees, relative to the longitudinal direction.

Some embodiments of the invention provide a retaining arrangement for securing an electronic module to a body, for use with a rail that extends in a longitudinal direction. A first end wedge and a second end wedge can be mounted on the rail, with the first end wedge having a first ramped end, with the second end wedge having a second ramped end, and with the first end wedge and the second end wedge being spaced apart from each other in the longitudinal direction when the retaining arrangement is in an extended configuration. An even number of inner wedges can each be slidably mounted on the rail between the first end wedge and the second end wedge, with a third ramped end of a first of the inner wedges engaging the first ramped end, and with a fourth ramped end of a second of the inner wedges engaging the second ramped end. An adjustment device can be configured to move the retaining arrangement into a compressed configuration by reducing a distance between the first end wedge and the second end wedge in the longitudinal direction. A first clamping surface on at least one of the inner wedges and a second clamping surface on the second end wedge can be urged away from the rail, when the retaining arrangement is moved into the compressed configuration, to secure the electronic module to the body.

Some embodiments of the invention provide a retaining arrangement for securing an electronic module to a body, for use with a rail that extends in a longitudinal direction and includes a threaded bore. A first end wedge with a first ramped end can be mounted on the rail. A second end wedge with a second ramped end can be mounted on the rail. At least one inner wedge with a third ramped end and a fourth ramped end can be slidably mounted on the rail between the first end wedge and the second end wedge, with the third ramped end engaging the first ramped end and the fourth ramped end engaging the second ramped end. A screw can be threaded into the threaded bore. The screw can be moved into the threaded bore to move the retaining arrangement into a compressed configuration, to secure the electronic module to the body, by reducing a distance between the first end wedge and the second end wedge in the longitudinal direction and thereby urging a first clamping surface of the at least one inner wedge away from the rail. A first-end mounting pin can extend through first-end mounting holes in the first end wedge, but not extend into the rail, with the first-end mounting pin extending across the screw opposite a solid wall of the first end wedge to secure the first end wedge to the screw.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 2 is a top, front, right isometric view of the retainer of FIG. 1 in an extended configuration;

FIG. 3 is a top plan view of the retainer of FIG. 1 in the extended configuration;

FIG. 4 is a left elevational view of the retainer of FIG. 1 in the extended configuration;

FIG. 5 is a cross-sectional view of the retainer of FIG. 1 in the extended configuration, taken along plane A-A of FIG. 4;

FIG. 7 is a top plan view of the retainer of FIG. 1 in the compressed configuration;

FIG. 8 is a cross-sectional view of the retainer of FIG. 1 in the compressed configuration, taken along plane A-A of FIG. 4;

FIG. 9 is a rear elevational view of the retainer of FIG. 1 in the compressed configuration, installed to secure a printed circuit board to a cold plate;

FIG. 11 is a top, front, right isometric view of the retainer of FIG. 10 in an extended configuration;

FIG. 12 is a top, front, right isometric view of the retainer of FIG. 10 in a compressed configuration;

DETAILED DESCRIPTION

Figure 1:
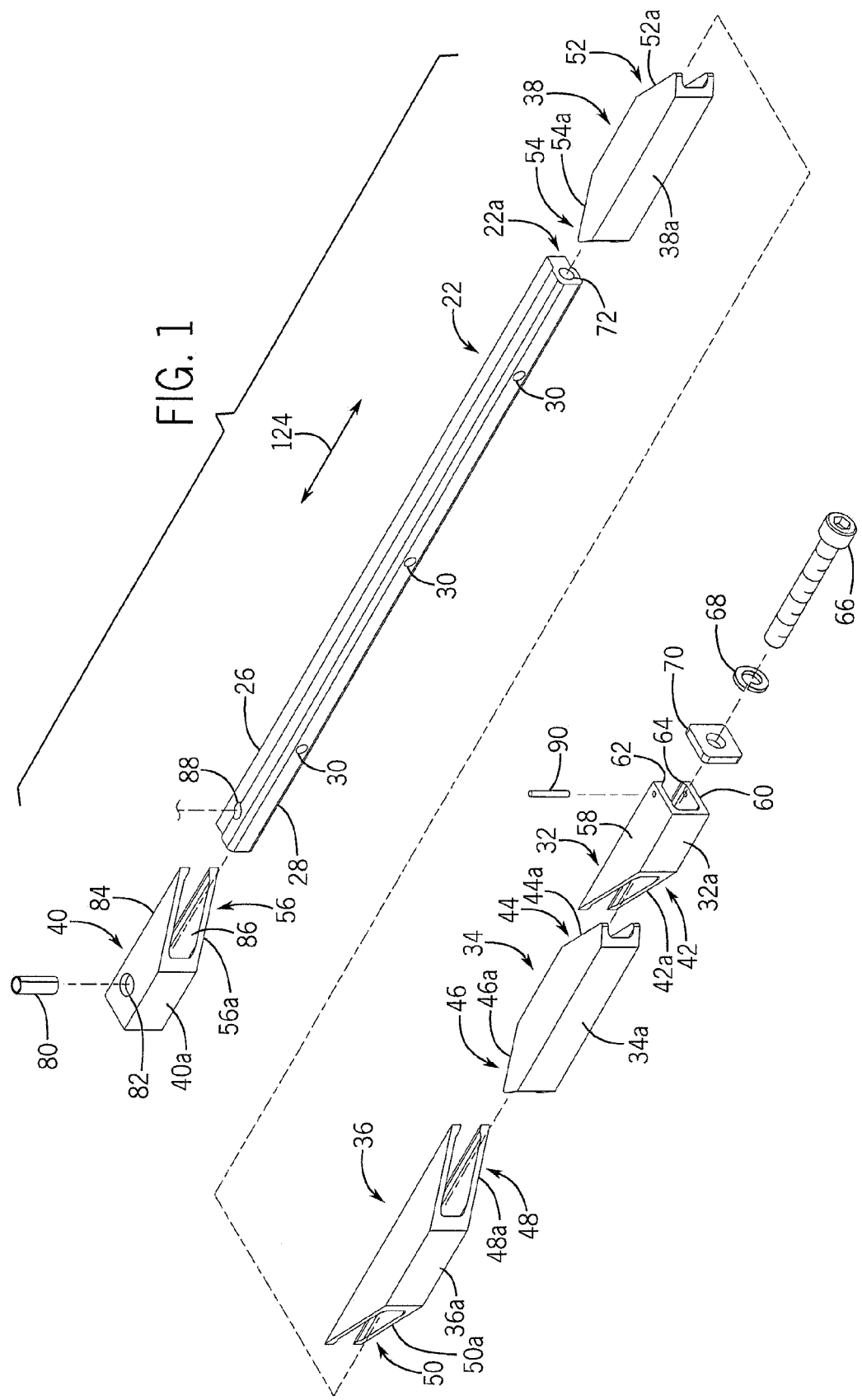
FIG. 1 is a top, front, right exploded isometric a retainer for an electronic module, according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Conventional retainers for securing an electronic module to a body can include sets of wedges with ramped ends. The wedges can be mounted on a rail in an interleaved wedge assembly, and the rail can be fixed in place on the electronic module (or on the body). An adjustment device (e.g., a screw extending through the wedges) can then be actuated (e.g., tightened) in order to compress the wedge assembly along the rail. As the wedge assembly is compressed, the overall length of the wedge assembly (and the retainer generally) is decreased, with the amount of overlap of the ramped ends of the wedges thereby increasing. Due to contact between the ramped ends of adjacent wedges, this collective shortening of the wedge assembly, and the corresponding increase in the overlap of the wedges, can result in some of the wedges moving laterally outward (i.e., perpendicularly to a longitudinal direction of the rail) away from the rail. With sufficient actuation of the adjustment device (e.g., sufficient tightening of the screw), these laterally moved wedges can be urged against the body (or the electronic module) and thereby secure the electronic module to the body.

Conventional retainers with interleaved wedges typically include ramped ends with contact angles of 45 degrees. In practice, however, this configuration may not always provide appropriately large retention force for a given input force at an adjustment device (e.g., a given tightening torque on an adjustment screw). Conventional designs of retainers with interleaved wedges typically also generally include only odd numbers of wedges. To date, this has been necessary to avoid requiring either of the end wedges to move laterally away from the rail to contact the retention body, when the screw is tightened. The inability to use even numbers of wedges, however, can impose undesired limits on the extended and compressed dimensions of retainers for particular settings.

Accordingly, a need exists for a retainer for electronic modules that can provide increased retention force for a given compression of the relevant wedge assembly (e.g., as may result from tightening an adjustment screw to a given torque setting). Further, a need exists for a retainer for electronic modules that can employ an even total number of wedges.

Generally, embodiments of the invention can address these (and other) needs. For example, some embodiments of the invention can include a retainer in which wedges with ramped ends are mounted on a rail in a serial, interleaved wedge assembly. Each of the ramped ends can be configured to engage the ramped end of an adjacent wedge in the wedge assembly (e.g., to directly bear on the ramped end of the adjacent wedge), and can exhibit a contact (e.g., internal) angle of between 20 and 30 degrees, relative to a longitudinal direction of the rail. A screw threaded into a bore at an end of the rail can be used to compress the wedge assembly, collectively, so that adjacent ramped ends are urged against each other. This, in turn, can cause some of the wedges to move laterally relative to the rail, to clamp an electronic module (e.g., a printed circuit board ("PCB")) to a body (e.g., a cold plate).

Some embodiments of the invention can additionally (or alternatively) include a configuration that allows an even number of wedges to be used. For example, an end wedge in a wedge assembly can be provided with a set of relatively large holes, as compared to the local width of the end wedge. During assembly, the holes in the end wedge can be aligned with a corresponding hole through (or set of holes in) a rail. A pin sized to fit in the smaller hole in the rail can then be inserted through the aligned holes to secure the end wedge to the rail. As the wedge assembly is compressed, the relatively large size of the holes used to secure the end wedge to the rail can allow the end wedge can move away from the rail, along with one or more inner wedges, to clamp an electronic module to a body. By allowing a clamping movement for an end wedge, this pinned arrangement can accordingly allow the wedge assembly to include an even number of wedges.

FIG. 1 illustrates certain components of a retainer 20 according to one embodiment of the invention. The retainer 20 includes a rail 22, which is generally elongate in a longitudinal direction 24. In order to slidably receive wedges of a wedge assembly, the retainer 20 includes a relatively narrow neck portion 26 and a relatively wide retention portion 28

Generally, the rail 22 is configured to be attached to an electronic module, or to a body to which the electronic module is to be secured by the retainer 20. In the embodiment illustrated, the rail 22 includes a set of three holes 30, which extend through the retainer 20, generally perpendicularly to the longitudinal direction 24 of the rail 22. In some embodiments, rivets (not shown) can be installed through the holes 30, in order to connect the rail 22 to a PCB (or to another body).

In other embodiments, a rail can be configured to be attached to a body or to an electronic module in other ways. For example, holes similar to the holes 30 can be threaded to receive screws instead of rivets. In some embodiment, holes similar to the holes 30 can be configured as blind holes (e.g., blind holes extending into the neck portion 26 of the rail 22).

To help provide clamping force to secure an electronic to a body, a wedge assembly can be mounted on the rail 22. In the embodiment illustrated, the retainer 20 includes a wedge assembly of five wedges, including an end wedge 32, inner wedges 34, 36, and 38, and an end wedge 40.

Each of the five wedges 32, 34, 36, 38, and 40 includes at least one ramped end, with the end wedges 32 and 40 each including one ramped end 42 and 44, respectively, and with the inner wedges 34, 36, and 38 each including two ramped ends 46 and 48, 50 and 52, and 54 and 56, respectively.

Each of the wedges 32, 34, 36, 38 and 40 includes a respective set of side walls (e.g., side walls 58 and 60 of the end wedge 32) that are generally spaced apart from each other by a distance that is larger than the width of the retention portion 28 of the rail 22. Accordingly, the wedges 32, 34, 36, 38 and 40 can be slid axially along the rail 22 during installation and adjustment, with the side walls (e.g., the side walls 58 and 60) sliding along opposite sides of the retention portion 28. Further, each of the side walls includes an angled retaining flange (e.g., retaining flanges 62 and 64 of the end wedge 32) that are generally spaced apart from each other by a distance that is larger than the width of the neck portion 26 but smaller than the width of the retention portion 92. Accordingly, the retaining flanges (e.g., the retaining flanges 62 and 64) can allow the wedges 32, 34, 36, 38, and 40 to move some amount laterally on the rail 22 (i.e., move in a direction perpendicular to the longitudinal direction 24), while also preventing the wedges 32, 34, 36, 38 and 40 from moving laterally off of the rail.

Generally, each of the ramped ends 42, 44, 46, 48, 50, 52, 54, and 56 includes a respective contact surface 42a, 44a, 46a, 48a, 60a, 52a, 54a, and 56a that extends at a respective contact angle 42b, 44b, 46b, 48b, 60b, 52b, 54b, and 56b (see FIG. 3) relative to the longitudinal direction 24. In the embodiment illustrated, the angles 42b, 44b, 46b, 48b, 60b, 52b, 54b, and 56b, are each substantially (i.e., within reasonable manufacturing tolerances) equal to 25 degrees. In other embodiments, other contact angles are possible, including contact angles in a range between 20 degrees and 30 degrees.

Generally, the wedges 32, 34, 36, 38, and 40 are configured to be slid along the rail 22, in order to secure an electronic module to a body. For example, because of the engagement (e.g., direct engagement, as illustrated) between adjacent pairs of the contact surfaces 42a, 44a, 46a, 48a, 60a, 52a, 54a, and 56a, sliding the two end wedges 32 and 40 closer together can cause clamping surfaces 34a and 38a of the wedges 34 and 38 to be urged laterally away from the rail 22. (Other similar surfaces of the wedges 32, 36, and 40 are similarly denoted as surfaces 32a, 36a, and 40a. When the wedge assembly is compressed, the surfaces 32a, 36a and 40a can urged generally towards the rail 22.)

An adjustment device for moving the wedges 32, 34, 36, 38, and 40 along the rail 22 can take various forms. In the embodiment illustrated, a screw 66 at one end of the wedge assembly is inserted through a lock washer 68 and a flat square washer 70 and threaded into a threaded bore 72 that extends longitudinally within the rail 22. By advancing the screw 66 into the bore 72, an operator can accordingly move the end wedge 32 longitudinally along the rail 22 towards the end wedge 40. With the end wedge 40 generally fixed in place relative to the rail 22, this movement of the end wedge 32 can urge the clamping surfaces 34c and 38c away from the rail 22, as also discussed above.

In other embodiments, other adjustment devices can be used. For example, in some embodiments, an adjustment device can be configured as a cammed lever (not shown), or other similar device, that can move the end wedge 32 longitudinally along the rail 22 similarly to the screw 66.

With the wedges 32, 34, 36, 38, and 40 mounted on the rail 22, the end wedges 32 and 40 can generally prevent the inner wedges 34, 36, and 38 from sliding longitudinally off of the rail 22. The end wedges 32 and 40 themselves can be secured to the rail 22 in various ways. In the embodiment illustrated, the end wedge 40 is secured at one end of the rail 22 with a pin 80 (e.g., a self-retaining spiral pin) that extends through holes 82 in sidewalls 84 and 86 of the end wedge 40 (only one of the holes 82 visible in the Figures) and through a hole 88 in the rail 22.

At an opposite end of the wedge assembly, the end wedge 32 is secured to the opposite end of the rail 22 with a pin 90 that does not extend through (or into) the rail 22. Rather, as illustrated in FIGS. 4 and 5 in particular, the pin 90 extends through the side walls 58 and 60 and across the screw 66, so that the three walls of the end wedge 32 and the pin 90 generally surround the screw 66. Accordingly, with the screw 66 threaded into the bore 72, the pin 90 and the end wedge 32 can engage the screw 66 to prevent the end wedge 32 from moving laterally off of the rail 22.

In other embodiments, other arrangements can additionally (or alternatively) help to retain the end wedge 32 on the rail 22, including with the retainer 20 in the extended configuration illustrated in FIGS. 2 through 5. For example, in some embodiments, the flat washer 70 can be adhered (e.g., glued) to the end of the end wedge 32, so that the flat washer 70 can help to hold the end wedge 32 on the screw 66, and thereby help to secure the end wedge 32 to the rail 22.

Generally, the wedge assembly of the wedges 32, 34, 36, 38, and 40 (and the retainer 20, generally) can be moved by the screw 76 (or another adjustment device) between an extended configuration and a compressed configuration. In an example extended configuration, as illustrated in particular in FIGS. 2, 3 and 5, the screw 66 has been advanced a relatively small amount into the threaded bore 72, so that the laterally outer walls of the wedges 32, 34, 36, 38, and 40 (e.g., the surfaces 32a, 34a, 36a, 38a, and 40a) are generally aligned in parallel with each other. In this extended configuration, for example, the retainer 20 can be slid into a slot (not shown in FIGS. 2 through 5) within which a PCB (or other electronic module) is to be retained. Generally, as illustrated in FIG. 2, the wedge assembly of the retainer 20 exhibits an extended-configuration length 100, with an extended-configuration width 102.

Figure 6:
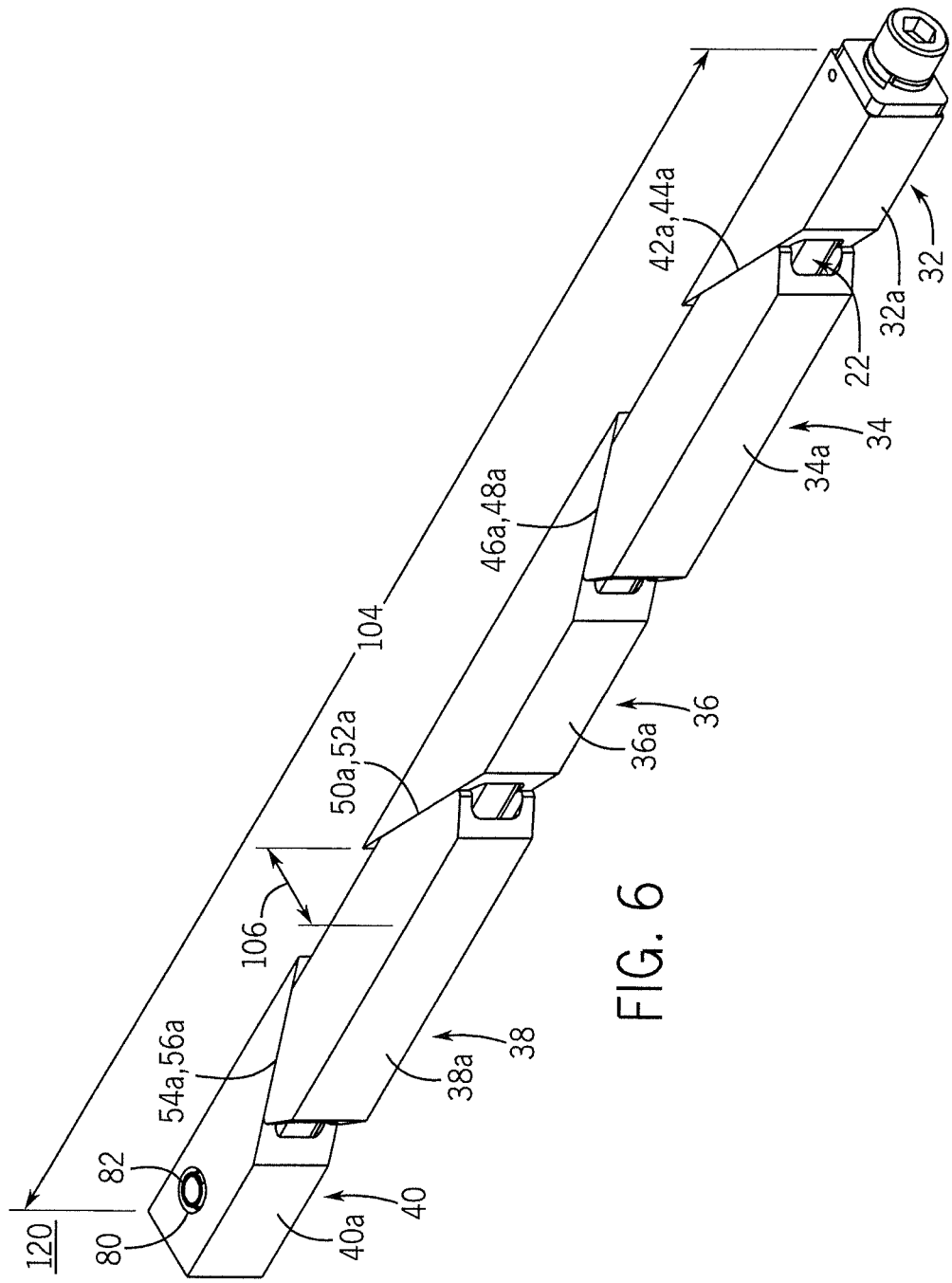
FIG. 6 is a top, front, right isometric view of the retainer of FIG. 1 in a compressed configuration.

From the extended configuration (e.g., as illustrated in FIGS. 2 through 5), the wedge assembly (and the retainer 20, generally) can be moved to a compressed configuration by advancing the screw 66 farther into the threaded bore 72 (or by actuating another adjustment device). As also discussed above, and as illustrated in FIGS. 6 through 9, the compression of the wedge assembly along the rail 22 can urge some of the wedges (e.g., the inner wedges 34 and 38) in a lateral direction relative to the rail 22 so that the clamping surfaces of the wedges (e.g., the clamping surfaces 34a and 38a) are urged laterally away from the rail 22. This compression, as illustrated in FIG. 6 in particular, can accordingly result in the wedge assembly of the retainer 20 exhibiting a compressed-configuration length 104 that is generally smaller than the extended-configuration length 100 (see FIG. 2), and a compressed-configuration width 106 that is generally larger than the extended-configuration width 102.

As also noted above, when in the compressed configuration, the retainer 20 can be readily used to secure an electronic module to another body. For example, as illustrated in FIG. 9 in particular, the rail 22 can be secured to a PCB 108, and the retainer 20 and the PCB 108 can then be slide into a slot 110 of a cold plate 112. When the retainer 20 is appropriately compressed, the enlarged compressed-configuration width 106 (see FIG. 6) can urge the inner wedges 34 and 38 (only the inner wedge 38 visible in FIG. 6) against the side wall of the slot 110 and thereby clamp the PCB 108 in place. As also noted above, in another configuration, the rail 22 can be secured to the cold plate 112 (or another similar body) and the inner wedges 34 and 38 urged against a relevant electronic module.

FIGS. 10 through 13 illustrated a retainer 120 configured generally similarly to the retainer 20, but with an even number of wedges, as may be useful to provide improved thermal performance or to allow the retainer 120 to fit within a particular space. Generally, features on the retainer 120 are numbered in FIGS. 10 through 13 similarly to corresponding features on the retainer 20 (or other contextual objects) in FIGS. 1 through 9, with an appended "1." For example, a rail 122 of the retainer 120 includes a neck portion 126 and a retention portion 128 (see, e.g., FIG. 10) that are configured similarly to the neck portion 26 and the retention portion 28 of the rail 22 (see, e.g., FIG. 1). Similarly, the retainer 120 includes a wedge assembly including an end wedge 132, two inner wedges 134 and 136, and an end wedge 140, each with corresponding ramped ends (e.g., ramped end 140) and contact surfaces (e.g., a contact surface 140*a*) configured to engage each other during operation of the retainer 120. For features (or contextual objects) of the retainer 20 with numbering extending into the 100s, a "2" is generally appended. For example, the retainer 120 can be used to secure a PCB 208 within a slot 210 of a cold plate 212 (see, e.g., FIG. 13).

In the embodiment illustrated, each of the various contact surfaces of the wedges 132, 134, 136, and 140 (e.g., the contact surface 140*a*) extends at a respective contact angle relative to a longitudinal direction 124 (e.g., at an angle 140*b*) that is substantially equal to 25 degrees. In other embodiments, other contact angles are possible, including contact angles in a range between 20 degrees and 30 degrees.

Figure 13:
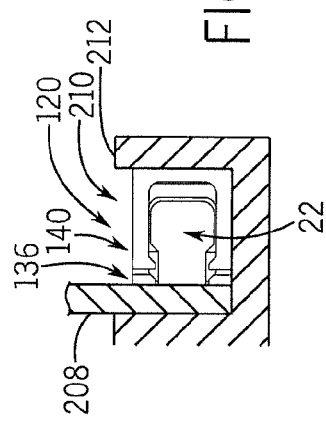
FIG. 13 is a rear elevational view of the retainer of FIG. 10 in the compressed configuration, installed to secure a printed circuit board to a cold plate.

Generally, the retainer 120 can be operated similarly to the retainer 20, with a screw 166 being advanced into a threaded bore 172 (see FIG. 10) in the rail 122 to move the wedge assembly from an extended configuration, with an extended-configuration length 200 and an extended-configuration width 202, to a compressed configuration with a compressed-configuration length 204 and a compressed-configuration width 206. Accordingly, as illustrated in FIG. 13, the retainer 120 can be used similarly to the retainer 20 to secure the PCB 208 within the slot 210, when the retainer 120 is in the illustrated compressed configuration.

In contrast to the retainer 20, however, because the retainer 120 includes an even number of wedges, one of the end wedges 132 and 140 may be required to move laterally to clamp the PCB 208 (or another electronic module) when the retainer 120 is moved into the compressed configuration. To facilitate this movement, the end wedge 140 can be secured to the rail 122 in a somewhat different manner than the end wedge 40 is secured to the rail 22 (see, e.g., FIG. 1).

Figure 10:
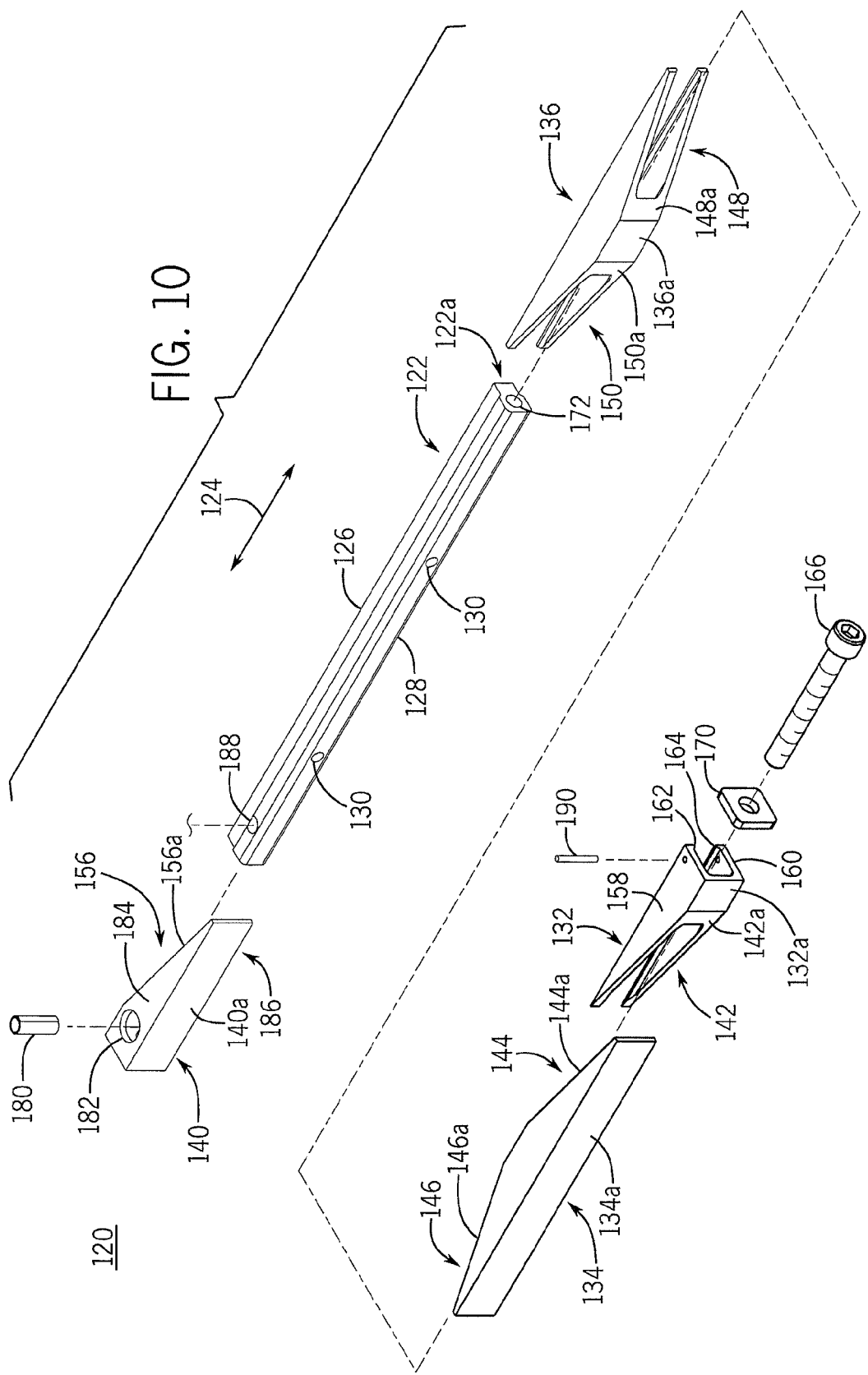
FIG. 10 is a top, front, right exploded isometric view of a retainer for an electronic module, according to another embodiment of the invention.

Similarly to the end wedge 40, side walls 184 and 186 of the end wedge 140 include holes 182. Further, the holes 182 can be generally aligned with a hole 188 in the rail 122 during assembly to receive a pin 190 (e.g., a self-retaining spiral pin) to secure the end wedge 140 to the rail 122. As illustrated in FIGS. 10 through 12, however, the holes 182 in the side walls 184 and 186 are generally configured with diameters 182*a* that are substantially larger than the hole 188 in the rail 122 and substantially larger than the pin 190. Accordingly, as illustrated in FIGS. 11 and 12, when the retainer 120 is moved from the extended configuration (FIG. 11) to the compressed configuration (FIG. 12), the end wedge 140 can move relative to the pin 190 (and the rail 122) so that a clamping surface 140*a* of the end wedge 140 moves away from the rail 122 to a similar extent as a clamping surface 136*a* of the inner wedge 136.

In the embodiment illustrated, the holes 182 each exhibit a diameter 182*a* that is 60% or more of the local width of the end wedge 140 (i.e., as measured in the same direction as the extended-configuration width 206 of FIG. 11). In other embodiments, other configurations are possible.

Figure 14:
FIG. 14 is a top plan view of a retainer for an electronic module, according to yet another embodiment of the invention, with the retainer in an extended configuration.
Figure 15:
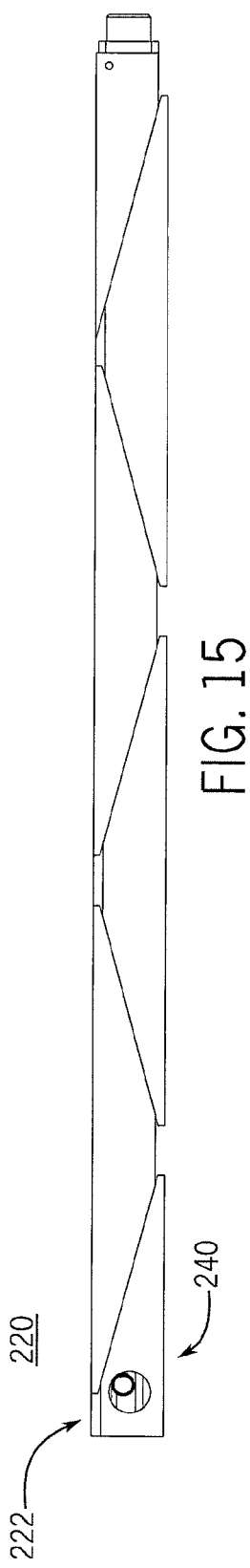
FIG. 15 is a top plan view of the retainer of FIG. 14 in a compressed configuration.

In other embodiments, other numbers of wedges can be used. For example, as illustrated in FIGS. 14 and 15, a retainer 220 can be configured similarly to the retainer 120, but with six total wedges, including an end wedge 240 that is mounted on a rail 222, and moves relative to the rail 222, similarly to the end wedge 140 (see, e.g., FIGS. 11 and 12).

As noted above, it can be useful to configure wedges for a retainer for electronic modules to have contact angles of less than 45 degrees. In particular, it can be useful to configure wedges to have contact angles of between 20 and 30 degrees, as this can provide a particularly useful balance between thermal functionality, ease of operation (e.g., self-release from a compressed configuration), and retention force.

When a retainer similar to the retainers 20, 120, and 220 is released from a compressed configuration, the frictional engagement between adjacent wedges (e.g., between the adjacent sets of contact surfaces 42*a* through 56*a* illustrated in FIG. 1) can resist the movement of the wedge assembly from the compressed configuration back to the extended configuration. Conversely, the elastic compression of the various wedges results in a force that tends to assist the return of the wedge to the extended configuration. The total force acting to return the wedges to the extended configuration once the wedges have been released from a compressed configuration (e.g., the elastic forces minus the frictional forces) can be referred to as a de-actuation force.

Figure 16:
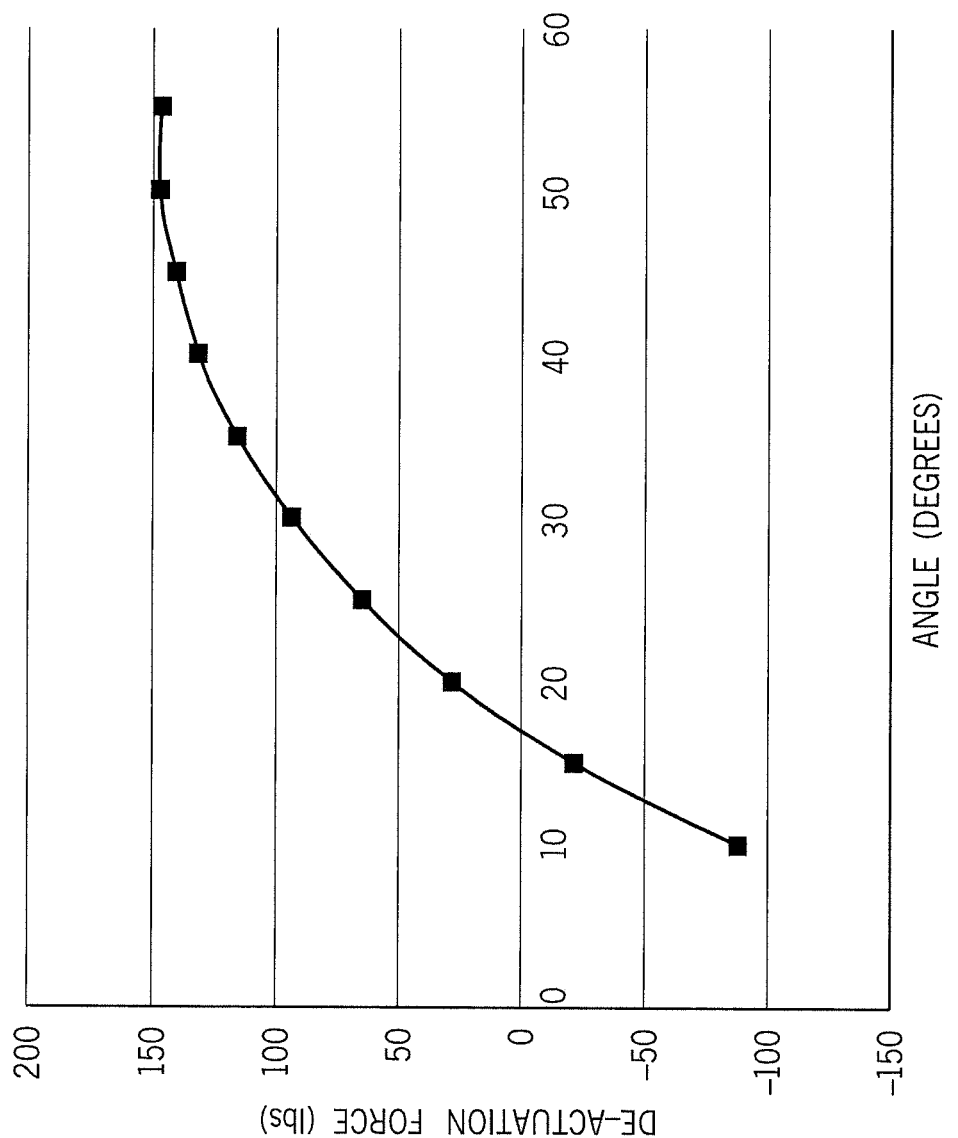
FIG. 16 is a graphical representation of de-actuation force for retainers with wedges having different contact angles.

As illustrated in FIG. 16, the de-actuation force for an example retainer (e.g., the retainer 20) generally increases with increases in the contact angles of the wedges of the retainer. Accordingly, for wedge-style retainers generally, the larger the contact angle, the more easily (and, potentially, automatically) the wedge assembly returns to an extended configuration after being released from a compressed configuration. Further, at particularly small contact angles (e.g. less than about 15 degrees) the frictional resistance to de-compression of the wedge assembly can be large enough overwhelm forces acting to return the wedge assembly to the extended configuration (e.g., elastic forces). When this occurs, the de-actuation force takes on a negative value and can prevent the wedge assembly from spontaneously relaxing to the extended configuration when the wedge assembly is released from the compressed configuration.

Figure 17:
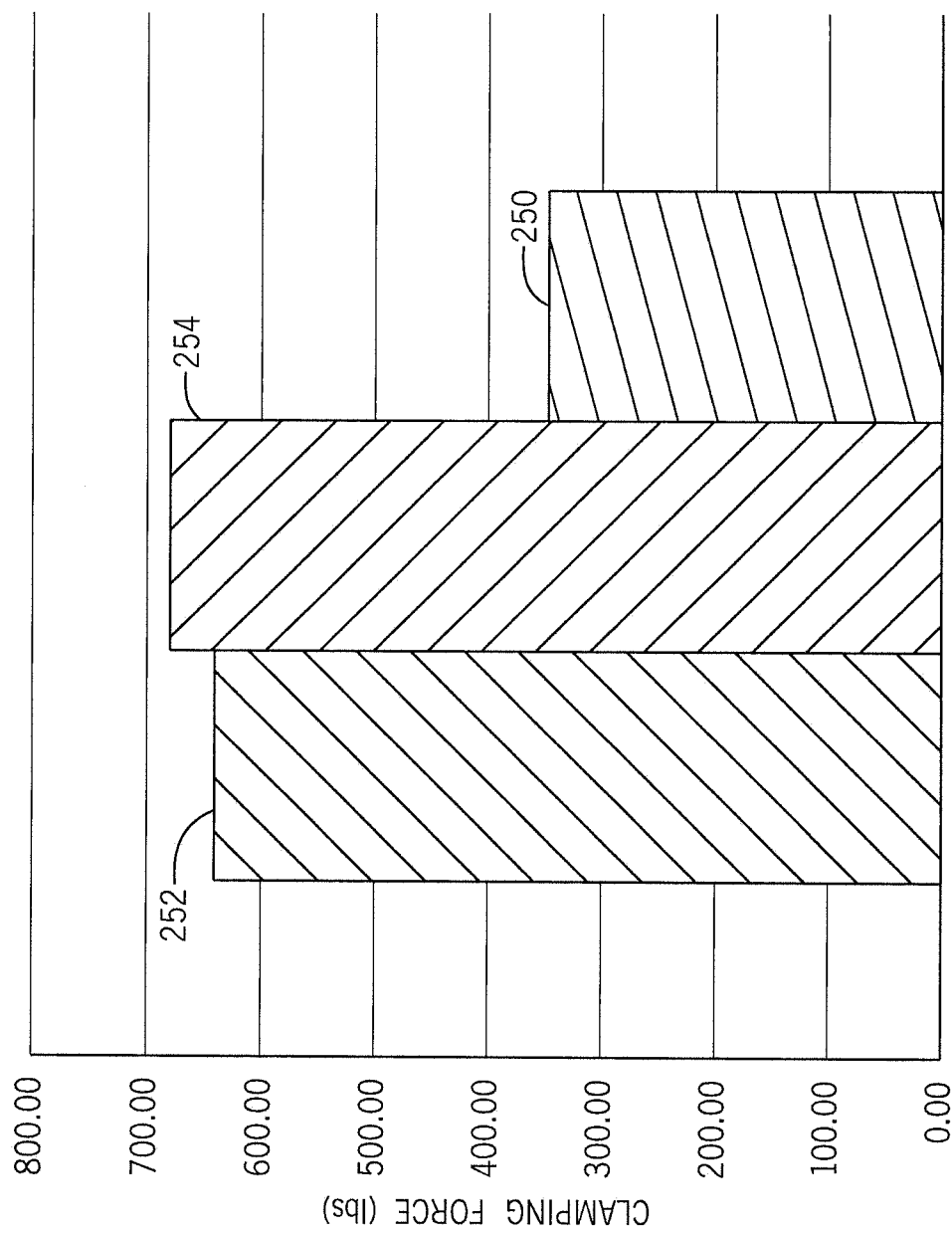
FIG. 17 is a graphical representation of clamping force for retainers with wedges having different contact angles.

Also with retainers similar to the retainers 20, 120, and 220, a smaller contact angle for the relevant wedges tends to provide a generally larger clamping force for retaining electronic modules, for a given input force at an adjustment device (e.g., a given torque at the screw 66). As illustrated in FIG. 17, for example, for a given input force at a screw adjustment device, a contact angle of 45 degrees can result in a clamping force of approximately 350 pounds (see bar 250), a contact angle of 30 degrees can result in a clamping force of approximately 640 pounds (see bar 252), and a contact angle of 15 degrees can result in a clamping force of approximately 680 pounds (see bar 254).

Finally, as noted above, retainers similar to the retainers 20, 120, and 220 can help to provide thermal contact for heat transfer between an electronic module (e.g., a PCB) and an object (e.g., a cold plate). The value of the relevant contact angles can also bear on the effectiveness of a retainer with regard to this heat transfer functionality. For example, an example retainer with contact angles of 30 degrees can exhibit thermal resistance that is approximately 10% smaller than a comparable retainer with contact angles of 45 degrees. Likewise, an example retainer with contact angles of 15 degrees can exhibit thermal resistance that is approximately 30% smaller than a comparable retainer with contact angles of 45 degrees.

Accordingly, although decreased contact angles generally allow for greater retention force for an electronic module and lower thermal resistance for heat transfer from the relevant electronic module, contact angles that are too small can result in relatively poor performance of a retainer in other ways (e.g., can result in retainers with negative de-actuation force). In light of the analysis illustrated in FIGS. 16 and 17, and generally outlined above, it may therefore be useful to provide a retainer with contact angles of between 20 and 30 degrees. Notably, this particular range of contact angles can provide relatively high clamping force and thermal performance, while avoiding the frictional binding between wedges characterized by negative de-actuation forces.

It will be understood that the values presented in FIGS. 16 and 17 and discussed above are presented as examples only and may relate only to certain configurations of a retainer. In general, however, the trends apparent from FIGS. 16 and 17, as discussed above, can be generally extended to many configurations of wedge-style retainers, in order to inform the selection of the appropriate contact angles for the relevant wedges.

Thus, embodiments of the disclosure provide for an improved retainer for electronic modules. Through the use of wedges with relatively small contact angles (e.g., angles between 20 and 30 degrees), relatively large retention force may be generated for a given force input (e.g., for a given torque setting of an adjustment screw) while avoiding unwanted binding of the retainer in a compressed configuration. Further, through the use of retention pins and appropriately sized mounting holes, retainers according to the invention can be configured to use even numbers of wedges, thereby allowing greater flexibility with regard to the installed dimensions of the retainers for a given desired clamping and heat transfer performance.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A retaining arrangement for securing an electronic module to a body, for use with a rail that extends in a longitudinal direction, the retaining arrangement comprising:
    a first end wedge mounted on the rail, the first end wedge having a first ramped end,
    a second end wedge mounted on the rail, the second end wedge having a second ramped end;
    at least one inner wedge slidably mounted on the rail between the first end wedge and the second end wedge, the at least one inner wedge including a third ramped end and a fourth ramped end, with the third ramped end engaging the first ramped end and the fourth ramped end engaging the second ramped end; and
    an adjustment device configured to move the retaining arrangement into a compressed configuration, to secure the electronic module to the body, by reducing a distance between the first end wedge and the second end wedge in the longitudinal direction and thereby urging a first clamping surface of the at least one inner wedge away from the rail;
    each of the first ramped end, the second ramped end, the third ramped end, and the fourth ramped end extending at a respective angle of between 20 degrees and 30 degrees, relative to the longitudinal direction.

2. The retaining arrangement of claim 1, wherein each of the respective angles is substantially equal to 25 degrees, relative to the longitudinal direction.

3. The retaining arrangement of claim 1, wherein a second clamping surface of one of the first end wedge and the second end wedge is urged moved away from the rail, when the retaining arrangement is moved into the compressed configuration, to secure the electronic module to the body.

4. The retaining arrangement of claim 3, wherein a total number of wedges included in the first end wedge, the second end wedge, and the at least one inner wedge is an even number.

5. The retaining arrangement of claim 3, wherein the adjustment device moves the retaining arrangement into the compressed configuration by sliding the first end wedge along the rail in the longitudinal direction; and
    wherein the second clamping surface is included on the second end wedge.

6. The retaining arrangement of claim 5, with the rail including a rail mounting hole, wherein the second end wedge is mounted to the rail with a second-end mounting pin extending laterally through the rail mounting hole and through second-end mounting holes in the second end wedge, each of the second-end mounting holes having a respective diameter that is larger than a diameter of the rail mounting hole.

7. The retaining arrangement of claim 6, wherein each of the respective diameters of the second-end mounting holes is 60% or more of a local width of the second end wedge, the second mounting holes thereby providing clearance, relative to the second-end mounting pin, for the second end wedge to move relative to the rail to secure the electronic module to the body.

8. The retaining arrangement of claim 1, further comprising:
    a first-end mounting pin extending through first-end mounting holes in the first end wedge, but not extending into the rail.

9. The retaining arrangement of claim 8, with the rail including a threaded bore, wherein the adjustment device includes a screw threaded into the threaded bore; and wherein the first-end mounting pin and the first end wedge collectively surround a part of the screw to secure the first end wedge to the screw.

10. A retaining arrangement for securing an electronic module to a body, for use with a rail that extends in a longitudinal direction, the retaining arrangement comprising:

a first end wedge and a second end wedge mounted on the rail, the first end wedge having a first ramped end, the second end wedge having a second ramped end, and the first end wedge and the second end wedge being spaced apart from each other in the longitudinal direction when the retaining arrangement is in an extended configuration;

an even number of inner wedges, each being slidably mounted on the rail between the first end wedge and the second end wedge, with a third ramped end of a first of the inner wedges engaging the first ramped end and a fourth ramped end of a second of the inner wedges engaging the second ramped end; and an adjustment device configured to move the retaining arrangement into a compressed configuration by reducing a distance between the first end wedge and the second end wedge in the longitudinal direction;

a first clamping surface on at least one of the inner wedges and a second clamping surface on the second end wedge being urged away from the rail, when the retaining arrangement is moved into the compressed configuration, to secure the electronic module to the body.

11. The retaining arrangement of claim 10, with the rail including a rail mounting hole, wherein the second end wedge is mounted to the rail with a second-end mounting pin extending through the rail mounting hole and through second-end mounting holes in the second end wedge, each of the second-end mounting holes having a respective diameter that is larger than a diameter of the rail mounting hole.

12. The retaining arrangement of claim 11, wherein each of the respective diameters of the second-end mounting holes is 60% or more of a local width of the second end wedge, the second mounting holes thereby providing clearance, relative to the second-end mounting pin, for the second end wedge to move relative to the rail to secure the electronic module to the body.

13. The retaining arrangement of claim 10, further comprising:

a first-end mounting pin extending through first-end mounting holes in the first end wedge but not extending into the rail.

14. The retaining arrangement of claim 13, with the rail including a threaded bore, wherein the adjustment device includes a screw threaded into the threaded bore; and wherein the first-end mounting pin extends across the screw opposite a part of the first end wedge to secure the first end wedge to the screw.

15. The retaining arrangement of claim 10, wherein each of the first ramped end, the second ramped end, the third ramped end, and the fourth ramped end extend at a respective angle of between 20 degrees and 30 degrees, relative to the longitudinal direction.

16. The retaining arrangement of claim 15, wherein each of the respective angles is substantially equal to 25 degrees, relative to the longitudinal direction.

17. A retaining arrangement for securing an electronic module to a body, for use with a rail that extends in a longitudinal direction and includes a threaded bore, the retaining arrangement comprising:

a first end wedge mounted on the rail, the first end wedge having a first ramped end, a second end wedge mounted on the rail, the second end wedge having a second ramped end, at least one inner wedge slidably mounted on the rail between the first end wedge and the second end wedge, the at least one inner wedge including a third ramped end and a fourth ramped end, with the third ramped end engaging the first ramped end and the fourth ramped end engaging the second ramped end;

a screw threaded into the threaded bore, the screw being movable into the threaded bore to move the retaining arrangement into a compressed configuration, to secure the electronic module to the body, by reducing a distance between the first end wedge and the second end wedge in the longitudinal direction and thereby urging a first clamping surface of the at least one inner wedge away from the rail; and a first-end mounting pin extending through first-end mounting holes in the first end wedge but not extending into the rail, the first-end mounting pin extending across the screw opposite a solid wall of the first end wedge to secure the first end wedge to the screw.

18. The retaining arrangement of claim 17, wherein each of the first ramped end, the second ramped end, the third ramped end, and the fourth ramped end extend at a respective angle of between 20 degrees and 30 degrees, relative to the longitudinal direction.

19. The retaining arrangement of claim 18, wherein each of the respective angles is substantially equal to 25 degrees, relative to the longitudinal direction.

20. The retaining arrangement of claim 17, wherein a second clamping surface of one of the first end wedge and the second end wedge is moved away from the rail, when the retaining arrangement is moved into the compressed configuration, to secure the electronic module to the body.

21. The retaining arrangement of claim 20, wherein a total number of wedges included in the first end wedge, the second end wedge, and the at least one inner wedge is an even number.

* * * * *